United States Patent [19]

Brownlie et al.

[11] Patent Number: 5,054,036
[45] Date of Patent: Oct. 1, 1991

[54] DIGITAL SIGNAL CODING

[75] Inventors: John D. Brownlie, Woodbridge; Barry G. Lloyd, Brighton, both of England

[73] Assignee: British Telecommunications Public Limited Company, London, England

[21] Appl. No.: 368,357
[22] PCT Filed: Dec. 1, 1987
[86] PCT No.: PCT/GB87/00861
 § 371 Date: May 31, 1989
 § 102(e) Date: May 31, 1989
[87] PCT Pub. No.: WO88/04500
 PCT Pub. Date: Jun. 16, 1988

[30] Foreign Application Priority Data

Dec. 1, 1986 [GB] United Kingdom ............... 8628655

[51] Int. Cl.⁵ .................. H04L 27/00; H03M 13/12
[52] U.S. Cl. ................................. 375/27; 375/39; 371/43
[58] Field of Search ............... 375/39, 27, 17, 56, 375/42; 371/30, 43, 44–46; 332/103, 149

[56] References Cited

U.S. PATENT DOCUMENTS 4,077,021 2/1978 Csajka et al. .................. 332/103
4,601,044 7/1986 Kromer, III et al. ............ 371/43

FOREIGN PATENT DOCUMENTS 0134101 3/1985 European Pat. Off. .

OTHER PUBLICATIONS

*Br Telecom Technol J*, vol. 2, No. 4, Sep. 1984, pp. 64–73, "Duplex Transmission at 4800 and 9600 Bit/s on the PSTN and The Use of Channel Coding with a Partitioned Signal Constellation", J. D. Brownie et al.
*IEEE Transactions on Information Theory*, vol. IT-28, No. 1, Jan. 1982, pp. 55–67, "Channel Coding with Multilevel/Phase Signals", G. Ungerboeck.
*IEEE Transactions on Communications*, vol. COM-33 (1985), Jan. No. 1, New York, USA, pp. 20–29, "Convolutional Coding Combined with Continuous Phase Modulation", S. Pizzi et al.
*IEEE International Conference on Communications*, 1985, vol. 2, Jun. 23–26, 1985, pp. 18.1.1–18.1.5, "Rotationally Invariant Trellis Codes for mPSK Modulation", M. Oerder.
*Advances in Instrumentations*, 1976, pp. 678-1–678-4, "Sequential vs. Viterbi Decoding for RF Data Transmission Links", Batson et al.

Primary Examiner—Benedict V. Safourek
Assistant Examiner—Ralph Smith
Attorney, Agent, or Firm—Nixon & Vanderhye

[57] ABSTRACT

A trellis coder has a convolutional encoder which has n states and can progress from a current state to a follower state depending on an input. The state progressions are selected such that they can be represented by a diagram having 90° rotational symmetry. A state transition produces via mapping means by quadrature modulation one of four output carrier signal phases, such that any three state sequence gives rise to a pair of signals having the same phase difference as the pair generated by a corresponding sequence having a position in the diagram rotated by 90° from that of the sequence in question. Input means enable a single bit data input to control the coder state progression so that a given differential output phase always corresponds to the same input bit value.

13 Claims, 11 Drawing Sheets

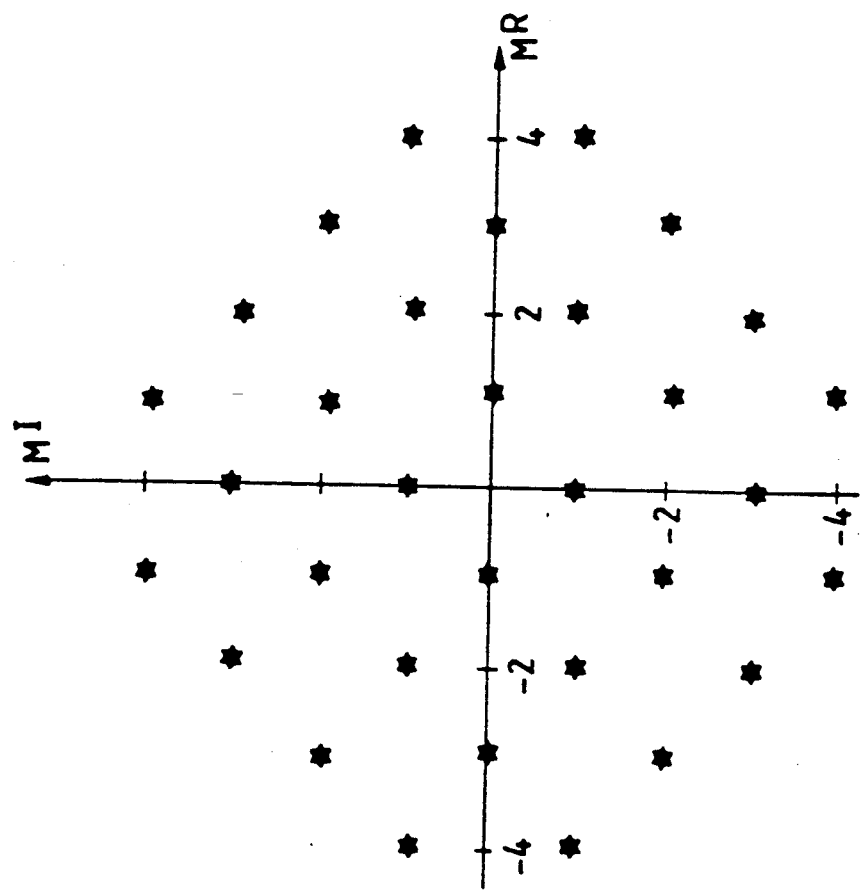
Fig.2(a). SIGNAL POINTS
Fig.2(b). MAPPING

Fig.3.(a) STATE TRANSITIONS

| STG STATE | 0 | 1 | 2 | 3 | 4 | 5 | 6 | 7 |
|---|---|---|---|---|---|---|---|---|
| SUBSET 0 STATE | 0 | 4 | 0 | 4 | 0 | 4 | 0 | 4 |
| SUBSET 1 STATE | 5 | 1 | 5 | 1 | 5 | 1 | 5 | 1 |
| SUBSET 2 STATE | 2 | 6 | 2 | 6 | 2 | 6 | 2 | 6 |
| SUBSET 3 STATE | 7 | 3 | 7 | 3 | 7 | 3 | 7 | 3 |

Fig.3.(b) SIGNAL SUBSETS

| 0 | 4 | 2 | 6 | 7 | 1 | 2 | 0 |
|---|---|---|---|---|---|---|---|
| 1 | 5 | 3 | 7 | 2 | 5 | 4 | 5 |
| 0 | 6 | 2 | 4 | 7 | 6 | 3 | 3 |
| 1 | 4 | 5 | 2 | 2 | 1 | 2 | 1 |
| 3 | 7 | 3 | 6 | 5 | 3 | 0 | 3 |

Fig.4.(a) STATE TRANSITIONS

| STG STATE | 0 | 1 | 2 | 3 | 4 | 5 | 6 | 7 |
|---|---|---|---|---|---|---|---|---|
| SUBSET 0 STATE | 0 | 6 | 0 | 6 | 0 | 6 | 0 | 6 |
| SUBSET 1 STATE | 7 | 1 | 7 | 1 | 7 | 1 | 7 | 1 |
| SUBSET 2 STATE | 3 | 6 | 2 | 5 | 4 | 3 | 0 | 7 |

Fig.4.(b) SIGNAL SUBSETS 000 110  
111 001

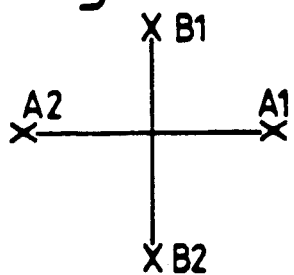
Fig.13.
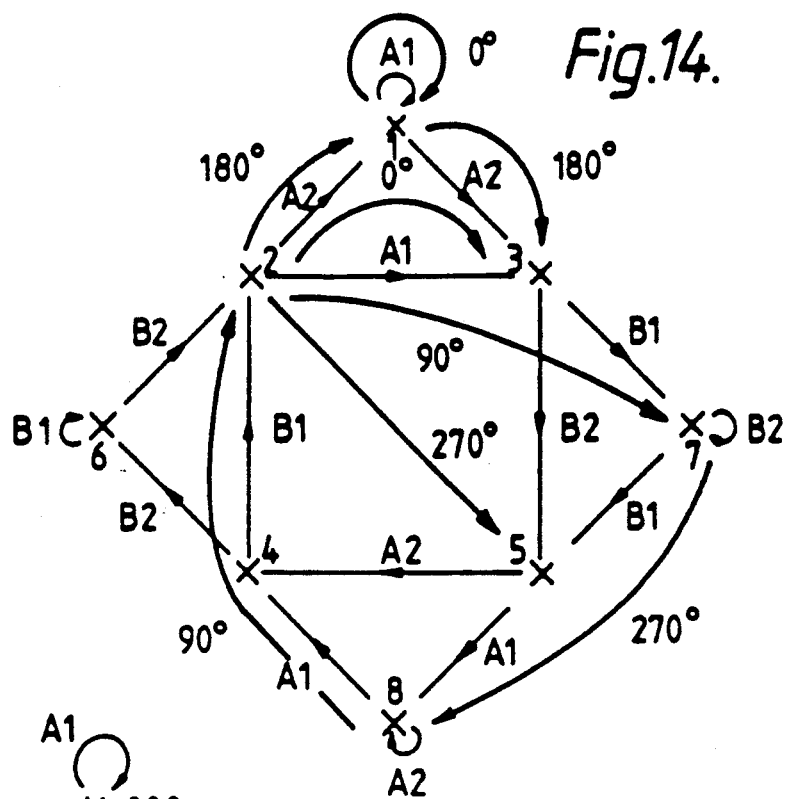
Fig.14.
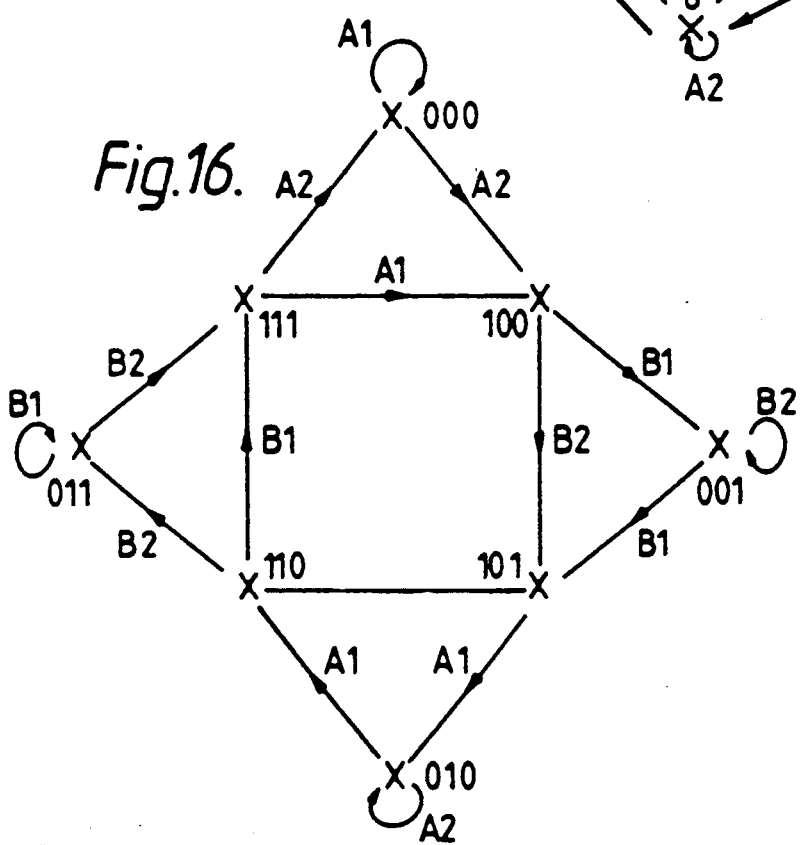
Fig.16.
Fig.17a.
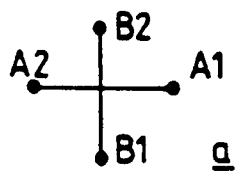
a
Fig.17b.
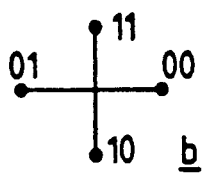
b

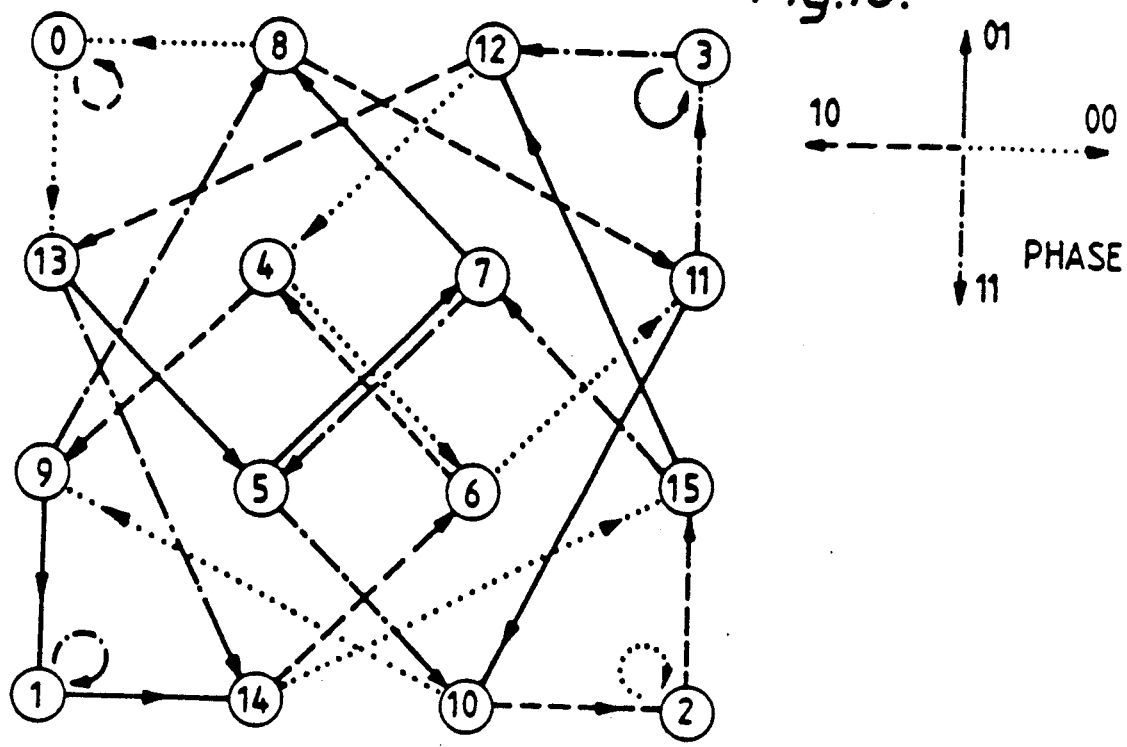
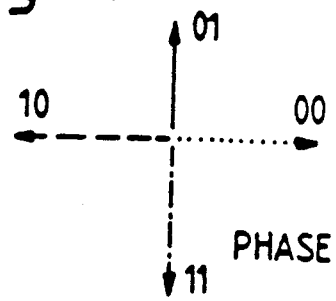
Fig.18.
Fig.19.

DIGITAL SIGNAL CODING

The present invention concerns modulation and demodulation of digital signals.

In phase amplitude modulation, each group of input bits selects one of a number of points in the phase diagram. In a trellis code, more points are allowed than are necessary for a one to one assignment of bit combinations and points; the selection is made with the aid of a convolutional encoder.

A convolutional encoder is at any time, in one of a number of states. It has an input which changes at symbol clock rate. The coder moves from its present state to a follower state in dependence on the input. The follower state may in some circumstances (i.e. some combinations of present state and present input) be the same as the present state. The output depends on the state, and may also depend on the input. This arrangement permits certain sequences of points whilst other sequences are inadmissible. A Viterbi decoder can then carry out 'soft decision' decoding, with an improvement in noise performance compared with coding using a non-redundant constellation of points. Trellis coding is discussed in some detail in "Channel Coding with Multilevel/Phase Signals" by G.Ungerboeck, IEEE Trans on Information Theory, Vol. IT-28 No. 1, January 1982.

If differential coding is employed, the coding can be chosen such that a 90° phase jump causes errors only temporarily after a jump occurs, and errors do not persist. This is referred to below as 90° phase jump immunity. Hitherto it has been thought that this requires differential coding on at least two bits per symbol.

It is now shown however, that trellis coding can be used with one bit per symbol and allow 90° phase jump immunity. This requires four points in the q.a.m. signal constellation.

According to the present invention there is provided a coding apparatus comprising (i) a convolutional coder having a plurality n of defined states and operable at regular intervals to assume a state which, for any preexisting state, is one of two mutually different states according to the binary value of an input thereto, such that if the behaviour of the coder is represented by a diagram in which each such state is represented by a point and each transition, and its direction, between two states or, as the case may be, transition from a state to the same state, is represented by a line whose ends are joined to the point(s) representing those states or that state, then that diagram can be so drawn that it is unchanged when rotated by any multiple of 90 degrees;

(ii) means responsive to the coder states to generate in respect of each possible pair of consecutive states an assigned one of four signals having relative phases 0, 90, 180 and 270 degrees, the assignment being such that each of the 4n possible sequences of three states gives rise to a pair of signals having the same signed phase difference as the pair generated by a corresponding sequence which, in the diagram, occupies a position rotated by 90° from that of the sequence in question; and (iii) input means responsive to a single bit input stream supplied thereto to produce the said binary input to the convolutional coder to so control the state transitions that one bit value gives rise to a singal of phase difference a or b from the preceding signal and the other bit value gives rise to a signal of phase difference c or d from the preceding signal, where a, b, c and d are different ones of the values 0, 90, 180 and 270 degrees.

Some embodiments of the invention will now be described, by way of example, with reference to the accompanying drawings, in which:

FIG. 1 is an outline diagram of a coding apparatus according to the invention, with a decoder;

FIG. 2a,b,c, illustrate signal point mappings, and a block diagram, of a CCITT standard V32 coder;

FIG. 3a,b illustrate state transitions and signal subsets of the V32 coder;

FIG. 4a,b illustrates the state transition and subsets for a first embodiment of coding apparatus according to the invention;

FIG. 13 illustrates signal phases;

FIG. 14 is a state diagram for a second embodiment of coding apparatus according to the invention;

FIG. 16 is the diagram of FIG. 14 with state numbers shown;

FIGS. 17a and 17b shows revised signal phase designations;

FIG. 18 is a state diagram for a third embodiment of coding apparatus; and

FIG. 19 is a block diagram of such an apparatus.

Figure 1:
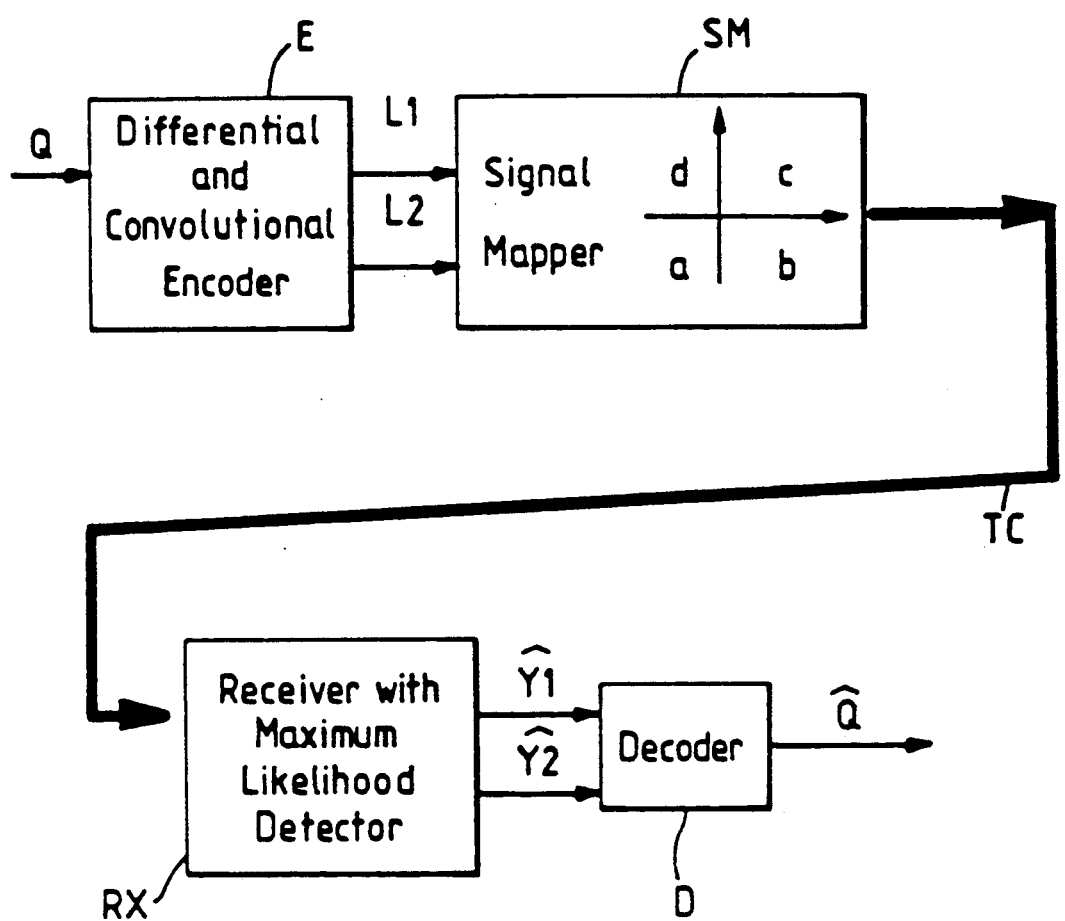

FIG. 1 shows the general arrangement of a transmission system embodying the invention. A single bit input Q feeds an encoder E which contains a convolutional encoder and arrangements for controlling its state transitions in dependence on the input Q such that a given output phase differential always corresponds to the same input bit value: generally this implies some differential coding of the input. A signal mapper SM includes a modulator which determines the output signal phases which are generated, in dependence on the coder state and the input signal appropriate information is supplied from the encoder via lines L1, L2.

The output signal is conducted via a transmission channel TC (of unknown delay and phase rotation) to a receiver RX with a maximum likelihood detector which produces a two-bit Y1, Y2 output, indicating which of the four signal points is deemed to have been received. A decoder D derives the single bit decoded output Q from Y1 and Y2.

Figure 2C:
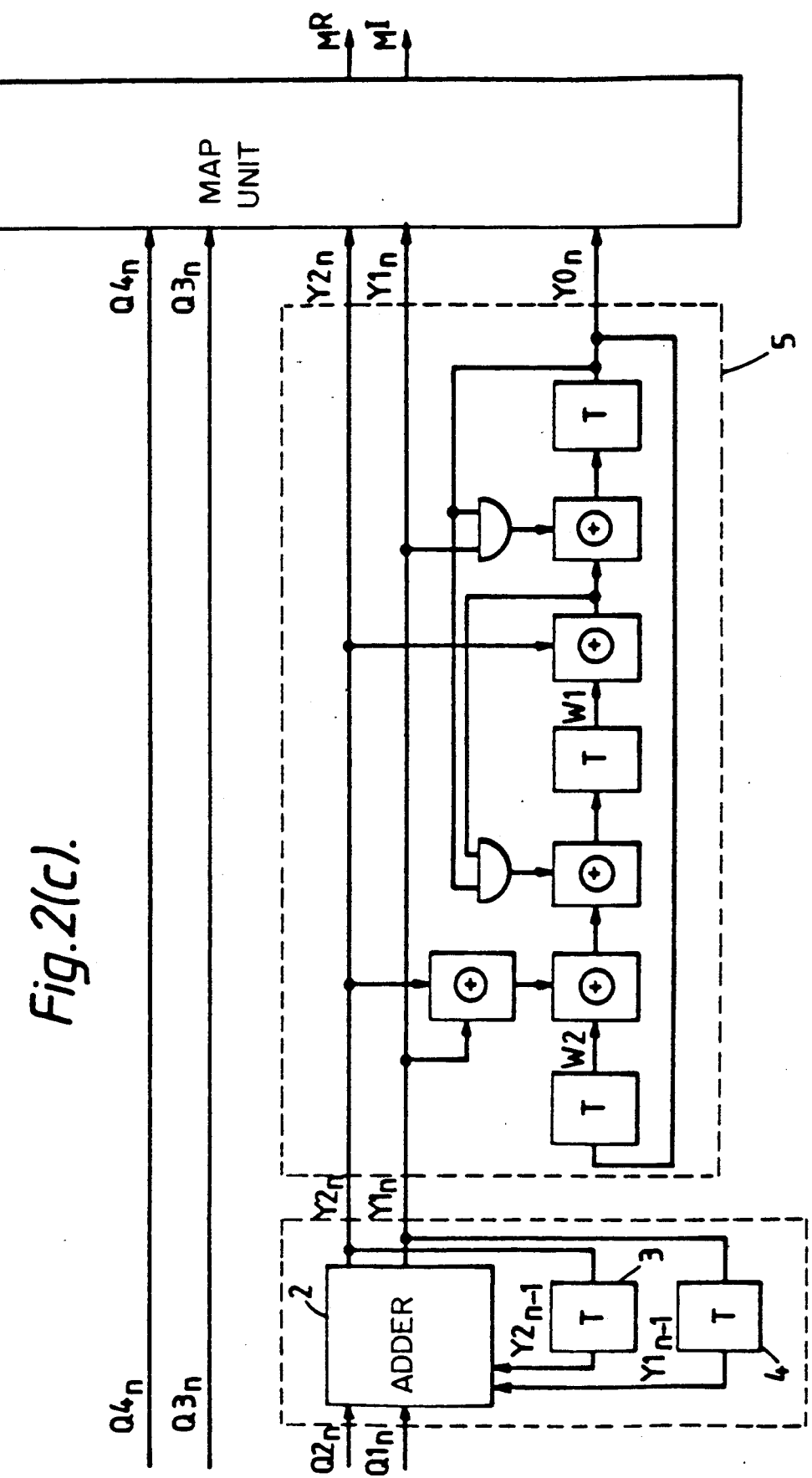

One embodiment of the invention is a modified version of the coder according to the CCITT V32 or V33 standard. Taking the V32 (9600 bit/s) code, this codes four bits per symbol, but employs 32 signal points in the QAM (quadrature amplitude modulation) phase diagram as compared with the sixteen required for modulation not employing a trellis code. The V32 points constellation is shown in the phase diagram of FIG. 2a. A V32 coder is shown in FIG. 2c, where groups of four input bits to be coded are designated Q1,Q2,Q3,Q4. From these are derived five bits: Q4 and Q3, unmodified, and Y2,Y1,Y0 to designate a signal point to be generated. The mapping of the 5-bit number Y0Y-1Y2Q3Q4 to the signal points is illustrated in FIG. 2 and is carried out by a mapping unit 1 which produces quadrature outputs $M^R$, $M^I$ corresponding to the axes of FIG. 2a. These drive a quadrature modulator (not shown). Below, those points having the same Y0Y1Y2 are referred to as a "subset" of the constellation. Bits Y1 and Y2 are derived from input bits Q1 and Q2 by differential coding as defined in Table 1. The process is equivalent to modulo-4 recursive addition (with Q2 and Y2 being the more significant bits) and is carried out by a modulo-4 adder 2 and one symbol-period delays 3, 4.

TABLE 1

| Differential Encoding | | | | | | | | | | | | | | | | |
|---|---|---|---|---|---|---|---|---|---|---|---|---|---|---|---|---|
| Inputs Q1, Q2 | 00 | | | | 01 | | | | 10 | | | | 11 | | | |
| Previous outputs | 00 | 01 | 10 | 11 | 00 | 01 | 10 | 11 | 00 | 01 | 10 | 11 | 00 | 01 | 10 | 11 |
| New outputs Y1,Y2 | 00 | 01 | 10 | 11 | 01 | 00 | 11 | 10 | 10 | 11 | 01 | 00 | 11 | 10 | 00 | 01 |

Bit Y0 is derived from Y1 and Y2 by a convolutional encoder 5. The coder has 8 states and, each symbol period, moves to a new state (which can, however, be the same as the preceding state) in dependence on Y2 and Y1. The output Y0 is a function of the coder state. The coder 5 comprises five modulo-2 adders (exclusive—OR gates), three one-symbol period delays, and two AND gates, as shown. The coder state can conveniently be represented by the 3 bits W2,W1,Y0, as shown.

Table 2 defines the V32 convolutional coding. Beneath each of the present states in the first row are given the 4 possible new dibits (Y1,Y2), and the consequent transmitted signal subset Y0Y1Y2 and new state W2W1Y0. The 3 bits shown in Table 2 as the signal subset are the first 3 of the 5 bits shown in FIG. 2b mapped onto the 32-point constellation. The remaining 2 bits serve to choose between the 4 points in each subset. The code transitions and subset mapping are represented more compactly in FIG. 3. The signal subset is presented as a modulo-8 integer Y0 Y1 Y2, and the coder state as a similar integer W2 W1 Y0. The 4 possible transitions from each starting state are shown in FIG. 3(a) below the state integer. The signal subset sent at each transition is shown above and to the left. Similar integers in FIG. 3(b) indicate the subset mappings.

TABLE 2

| V32 convolutional Encoding | | | | | | | | | |
|---|---|---|---|---|---|---|---|---|---|
| I | | | | | | | | | |
| Present state (W2,W1,Y0) | 000 | 001 | 010 | 011 | 100 | 101 | 110 | 111 | |
| | new bits | new bits | new bits | new bits | new bits | new bits | new bits | new bits | |
| (Y0, Y1, Y2) | | | | | | | | | |
| Signal subset | 0 00 | 1 00 | 0 00 | 1 00 | 0 00 | 1 00 | 0 00 | 1 00 | |
| New coder state | 000 | 100 | 001 | 111 | 010 | 110 | 011 | 101 | |
| Signal subset | 0 01 | 1 01 | 0 01 | 1 01 | 0 01 | 1 01 | 0 01 | 1 01 | |
| New coder state | 011 | 101 | 010 | 110 | 001 | 111 | 000 | 100 | |
| Signal subset | 0 10 | 1 10 | 0 10 | 1 10 | 0 10 | 1 10 | 0 10 | 1 10 | |
| New coder state | 010 | 111 | 011 | 100 | 000 | 101 | 001 | 110 | |
| Signal subset | 0 11 | 1 11 | 0 11 | 1 11 | 0 11 | 1 11 | 0 11 | 1 11 | |
| New coder state | 001 | 110 | 000 | 101 | 011 | 100 | 010 | 111 | |

Our objective is to modify the code to code only one bit per symbol. For the same symbol rate as standard V32 this implies a bit rate of 2400 bit/s, though clearly the actual rate is not significant to the invention. We now require to use four points of the constellation. Hence we cannot use more than four of the eight signal subsets. In order to preserve the 90° phase-jump immunity, it follows that the four points must be chosen from subsets 0,1,6,7 or from subsets 2,3,4,5 (see FIG. 3) and that any fixed pattern of bits Q3,Q4 (and Q5,Q6 in V33) would give four points with quadrant symmetry in the phase diagram once the choice of four subsets is made. The uncoded bits could be used to set different power levels for 4-point signal transmission.

Inspection of Table 2 shows that signals can be restricted to subsets 0,1,6,7 if we set Y1=Y0 (or subsets 2,3,4,5, if we set Y1=not Y0). The possible transitions from each state are then reduced to 2, as given in FIG. 4. Reference to FIG. 2 will show that the feedback conditions represented by setting Y1=Y0 is acceptable in that the feedback path includes a delay within the encoder. Therefore the encoder output will remain a valid V32 trellis-coded sequence.

Q1 at the differential coder input must be replaced by a value which is consistent with the condition Y1=Y0. Since the modulo 4 adder gives $Y1_k = Q1_k \oplus Y1_{k-1}$ this implies $Y0_k = Q1_k \oplus Y0_{k-1}$ i.e. $Q1_k = Y0_k \oplus Y0_{k-1}$ (1)

Figure 5:
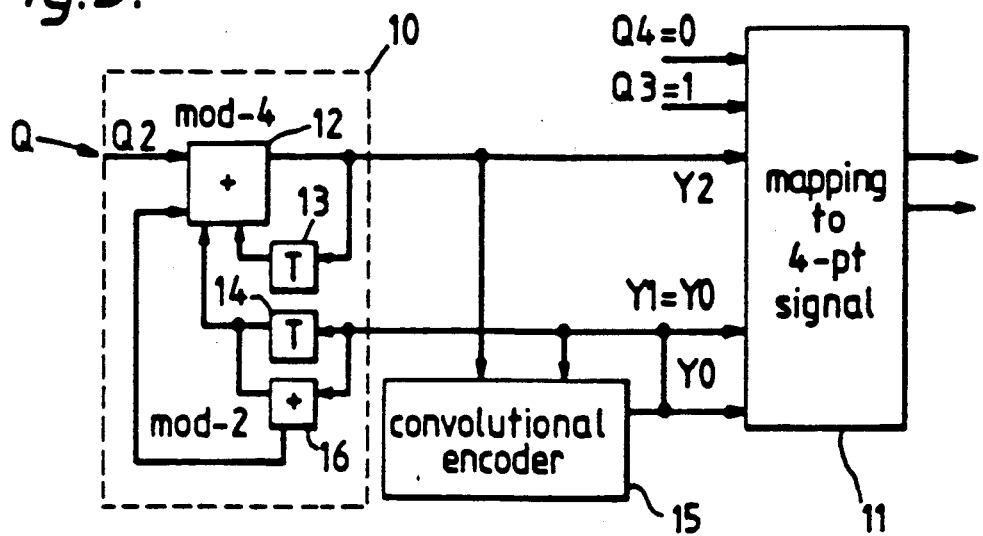
FIG. 5 is a block diagram of the apparatus illustrated by FIG. 4.

The coder according to this first embodiment of the invention is shown in FIG. 5, and comprises a mapping unit 11; an input unit 10 having a modulo-4 adder 12, delays 13, 14; and a convolutional encoder 15 (all identical to those of FIG. 2). It differs from FIG. 2 in that:
 (a) Q4 and Q3 are fixed
 (b) the single bit input is fed to the input designated Q2
 (c) the Y1 input to the mapping unit 11 and convolutional encoder 15 is supplied from the convolutional encoder output Y0 (though in fact they could still be connected to the less significant output of the modulo-4 adder since this will always be equal to Y0).
 (d) the original Q1 input to the modulo-4 adder 12 is now supplied by a modulo-2 adder (exclusive-OR gate) 16 whose inputs are supplied with, respectively, Y0 from the convolutional encoder 15 and delayed Y0 via the delay 14.

The signals coded by the coder of FIG. 5 can be decoded by a standard V32 decoder, to give the single output bit Q2; the unwanted bits Q1,Q3,Q4 being discarded.

The asymptotic coding gain of this coder over uncoded 2-point transmission is 3.98 dB, the same gain as at 9600 bit/s over uncoded transmission. The actual gain in performance will be higher at 2400 bit/s than at 9600 bit/s because there are a good deal fewer nearest neighbours (see below). In V32 and V33 there can be 16 nearest neighbours to a particular trellis path. In a 2400 bit/s mode there can be only one nearest neighbour to a particular trellis path, and some paths have no nearest neighbour, only a next nearest neighbour.

The above implementation of the coder is a convenient one because of its relationship to the V32 coder.

However, it posses a degree of redundancy in the hardware implementation—most obviously in that one output of the modulo-4 adder is unused—also the delay 14 is unnecessary since a delayed version of Y0, namely W2 is available within the convolutional encoder 15.

Figure 6:
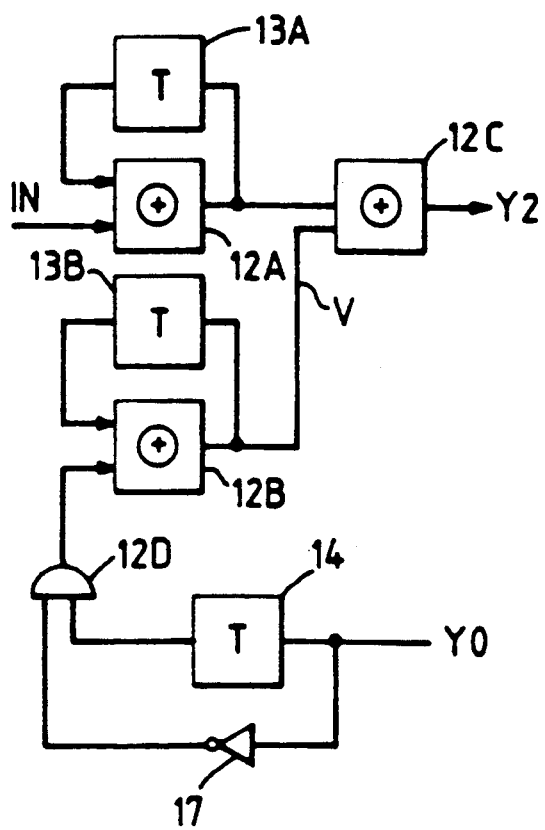
FIG. 6 illustrates alternative logic for FIG. 5.

The arrangement represented in FIG. 5 by adders 12,16 and delays 13,14, is logically identical to the arrangement shown in FIG. 6, with three exclusive-OR gates 12A,12B,12C three delays 13A,13B,14, and AND gate 12D and inverter 17. We have not troubled to omit the redundant delay 14; in fact it can be shown that the output V of the gate 12B is a logical function of the coder state-viz $$V = (W2 \text{ AND } W1) \text{ OR } (W2 \text{ AND } (W1 \oplus Y0)) \quad (2)$$

It will be seen that the encoder 15 (with the Y1 Y0 strap) forms the convolutional coder defined in claim 1, the unit 11 forms the mapping means responsive to the coder state (and to the signal Y2), and the unit 10 forms the input means. Alternatively the items 12B,12C,12D,13B,14 and 17 (or equivalent logic according to equational (2)) along with exclusive-OR gate 12 could be regarded as part of a modified convolutional coder, the input means being only the modulo-2 differential coding of 12A and 12A.

Before discussion of further embodiments of the invention, the concept of a geometrically constrained state transition diagram is introduced. This can give a very helpful representation of the behaviour of the convolutional encoder. In particular the constraints placed on the convolutional encoder by the 90° phase jump immunity requirement are represented by certain symmetry requirements imposed on the state transition diagram.

Figure 7:
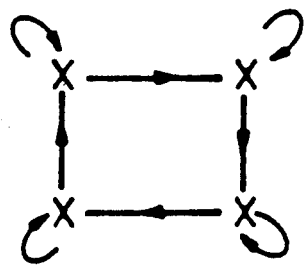
FIG. 7 is an illustration of a state diagram.

The state diagram consists of a number of points (represented in FIG. 7 by crosses) each representing a respective encoder state, with an arrowed line indicating each allowed transition from a state to another state (or to itself if this is allowed). FIG. 7 represents the trivial case of a regularly clocked 2-bit counter which is enabled by some input. When disabled, the follower state is the same as the present state; the selection between the two follower states from any state is made by the input.

Figure 8:
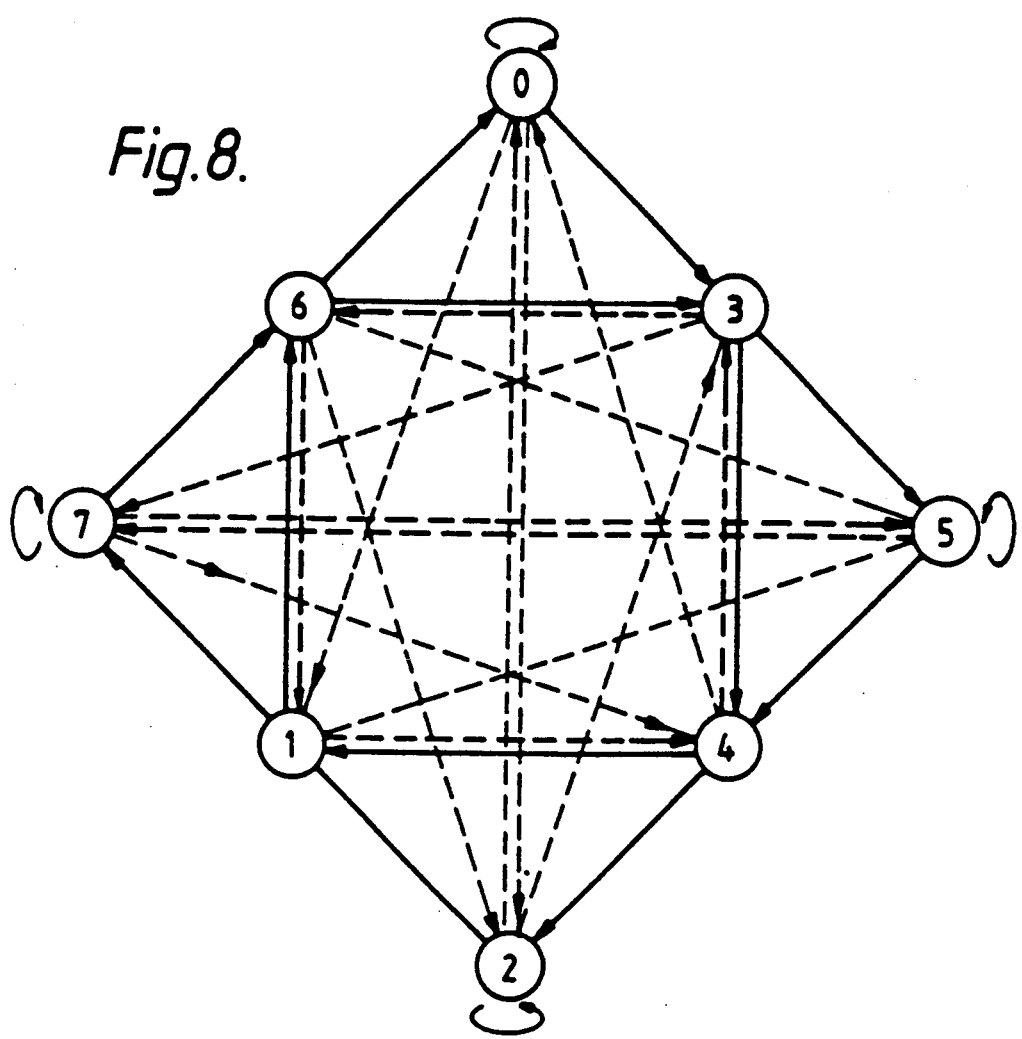
FIG. 8 is a state diagram for the V32 coder of FIG. 2.

FIG. 8 shows a state diagram for the V32 convolutional encoder 15 of FIG. 2. State numbers are shown within circles representing the states in question. The solid arrows represent those transitions which correspond to Y1=Y0 and the dotted arrows correspond to Y1=not Y0. It follows that the solid arrows alone represent the behaviour of the convolutional coder 15 of FIG. 5.

Considering the general problem of the construction of a state diagram for an 8-state encoder, for coding a one-bit input to the coder into a four-point constellation, clearly there are two possible transition paths from any state, and two possible paths to any state (note that the possibility of a path entering and leaving the same state is not excluded).

Every allowed coder-state sequence must in this instance be one of a set of 4 valid coder-state sequences corresponding to the 4 possible 90-degree phase rotations of the received signal. It is here postulated that this constraint can be made inherent in the state transition diagram by requiring the latter to be drawn in 90-degree rotational symmetry. Y1=Y0 transitions of the V. 32 modulation code drawn in 90-degree rotational symmetry, i.e. in a manner which displays the code's property of providing immunity to 90-degree rotations in the received signal. As the diagram is rotated through a succession of 90-degree angles, its shape remains constant, including the directions of the arrows indicating transitions.

Figure 9:
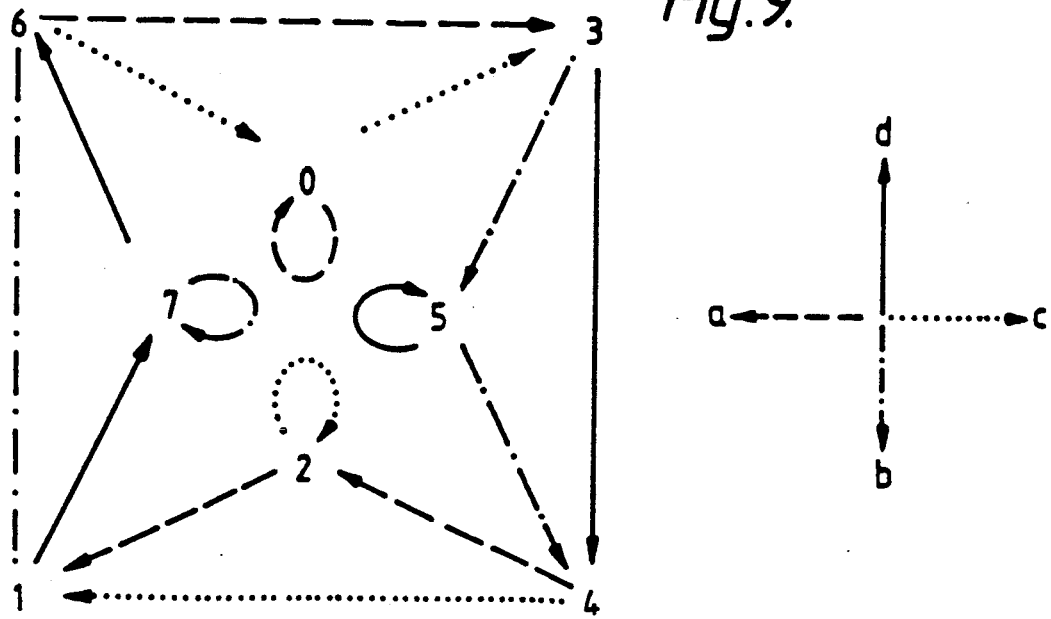
FIG. 9 is a state diagram for the apparatus of FIG. 5.
Figure 10:
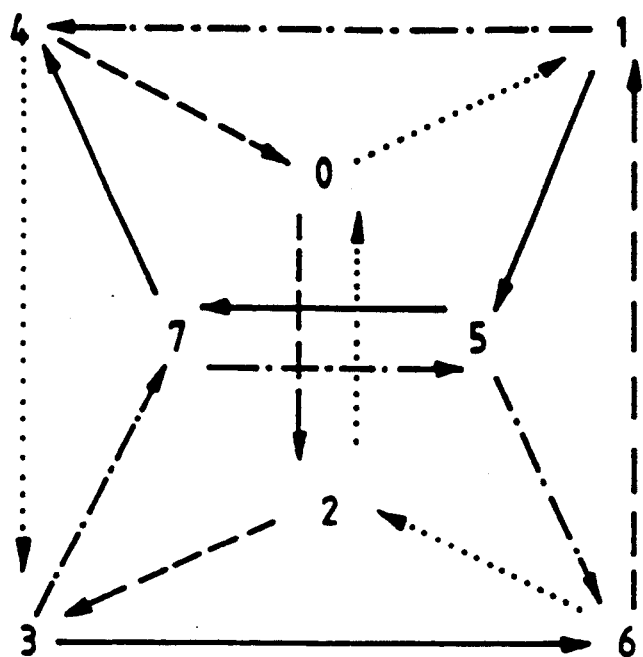
FIGS. 10 and 11 illustrate for the apparatus of FIG. 5 some possible alternative state diagrams which could be used in the apparatus.

For the system to have the desired phase immunities, a further condition is required, and this is on the mapping of state transitions onto transmitted signal points. This further condition can also be represented on the state transition diagram. Such representation has been included in FIG. 9 where the types of line (solid, dotted, broken or dot-dash) used for the arrows indicate the mapping of those transitions onto the 4 signal points illustrated in the right half of FIG. 9. As FIG. 9 is rotated through a succession of 90-degree angles in a clockwise direction, the transition-related signal points all change in the order. . . abcdabcd. . . , though of course from a variety of different starting points. It is a necessary condition for 90-degree phase immunity in the system that the ordering of this sequence of mapped-onto signal points be the same for all the transitions in the state transition diagram, as the latter is stepped through a succession of 90-degree rotations in a consistent direction. This condition is also satisfied in respect of V. 32 code transitions corresponding to the constraint Y1=notY0, as shown in the state transition diagram, FIG. 10. Note that the states labelled 1,4,3,6 in FIG. 8 have been rotated through 180 degrees in order to clarify FIG. 10. FIGS. 9 and 10 define state transition diagrams for modulation codes suitable for transmitting one information bit per symbol in a manner providing immunity to 90-degree phase ambiguities at the receiver. They can both be derived from the V. 32 code.

Figure 11:
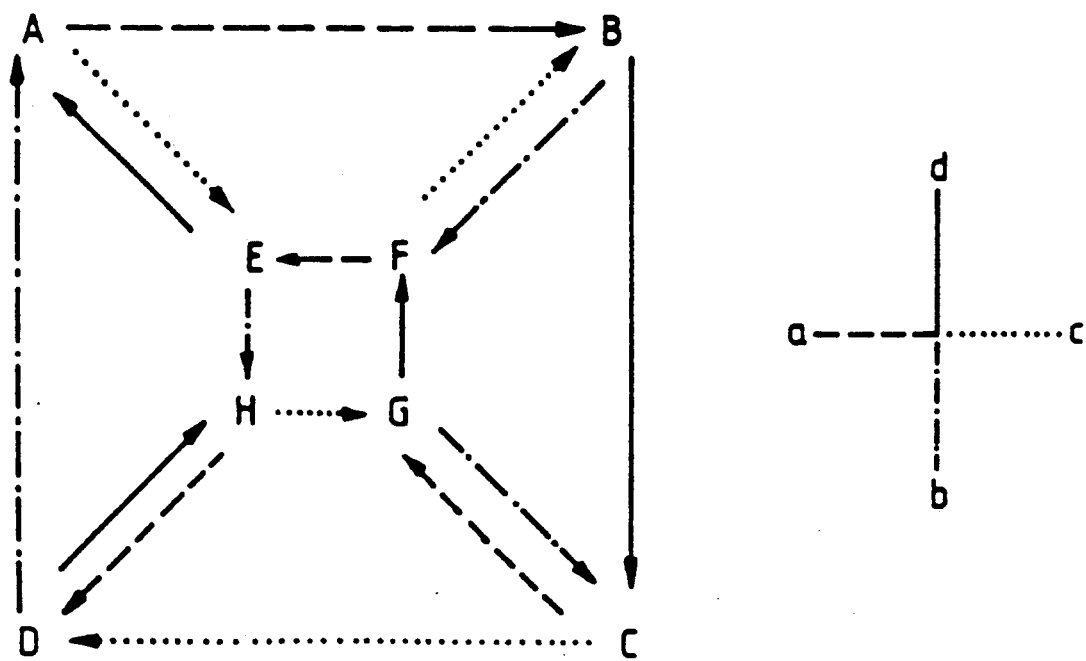

FIG. 11 shows the state transition diagram for another 8-state code which provides immunity to 90-degree phase ambiguities, and FIG. 18 shows a 16-state code which also provides such immunity. These diagrams can readily be checked as conforming to the rules given above for such codes.

The practical intent in providing modulation codes for transmission is to achieve an enhanced immunity to noise in the transmission channel, relative to uncoded modulation. The use of coded modulation spreads the influence of a particular information bit over a number of transmitted signals rather than a single two-dimensional signal sample as in uncoded modulation. The objective is to achieve a large total 'distance' between the two signal sequences transmitted for any two different information bit sequences. The appropriate measure of distance is the sum of the squares of the distances between the two signals summed over that number of symbols in which they are caused to differ by virtue of the two different information bit sequences. A pair of signal sequences which have the minimum distance between them allowed by the modulation coding for different information sequences is known as a 'nearest-neighbour' pair. It is desirable to design a code which, within other constraints, maximises the nearest-neighbour distance.

For the codes considered in detail here, only two transitions occur from each coder state. To achieve large signal distance, it is desirable that the signal points mapped from these transitions should be diagonally opposite points in the constellation. This leaves two choices, either the pair including the previously transmitted signal point or the pair which excludes that point. Again for achieving large signal distances, it is desirable that a pair of signals mapped from any pair of state transitions which lead into a common state should also be a diagonally opposite pair. With a 4-state code it is not possible to satisfy both of these requirements as well as provide immunity to 90 degree phase ambiguities. However with codes of 8 or higher-multiples of 4 states, it is possible to satisfy the phase requirement and achieve the maximum possible signal distance when diverging from a common state and when converging into a common state. This can be seen in all 3 of the 8-state codes for which state transition diagrams are given here. If we define the distance between nearest signal points as unity, then the squared distance between a pair of diagonally opposite states is 2. This is also the squared distance between the only two signal points used in the comparable uncoded modulation. With a squared distance of 2 both on diverging from and converging into a common state, we ensure a squared distance of at least 2+2 between any pair of state transition sequences corresponding to distinct sequences of information bits. This ensures a coding gain (over uncoded modulation) of $10*LOG(4/2)=3$ dB.

With an 8-state code providing 90-degree phase immunity, it is possible to ensure that transition paths, once diverged, will not reconverge until at least the third transition. This is demonstrated in the three such code examples defined in FIGS. 9 to 11. The question arises whether it is possible to ensure an extra contribution to the squared distance between nearest neighbour paths by virtue of the second pair of transitions, i.e. those occuring after the first divergence and before the possible reconvergence on the third transition. No such contribution can be guaranteed if central transition pairs could possibly be mapped onto the same signal point. With the state transition diagram in FIG. 11, this is possible. For example, state paths A(a)B(d)C(c)D(d)H and A(c)E(d)A(c)E(b)H where lower case letters indicate signal points, have common source and destination states, and therefore encompass the whole period of signal distinction between two information sequences, and the inner(two) transition pairs make no contribution to signal distance.

The codes represented in FIG. 9 and 10 do both ensure a contribution to signal distance from a central transition pair. The means by which this is achieved is as follows. States are separated into two categories, which we shall refer to as 'V' states and 'W' states respectively. V states are those for which the pair of signal states mapped onto for outgoing transitions are the same pair as those mapped onto for incoming transitions. (These must of course include the reentrant states 0, 7,2, and 5 in FIG. 9). In contrast, W states are those for which outgoing transitions map onto a different pair of signal points from those which incoming transitions map onto. In both FIGS. 9 and 10, states 0, 7, 2, and 5 are V states, and the rest are W states. Both codes have the property that a pair of transitions from a common state are always into one V state and one W state. This ensures that the second transition pairs are chosen from two different pairs of diagonally opposite signal points. The second pair of the guaranteed 3 transitions-pairs in a nearest neighbour pair therefore ensures a further squared distance of 1, giving a total squared distance of 5, and a coding gain of $10*LOG(5/2)=3.98$ dB.

In a 16-state code, it is possible to guarantee that four transition pairs must occur before a pair of diverged paths reconverge. In the code defined in FIG. 18, states 0, 1, 2, 3, 4, 5, 6 and 7 are V states, and the rest are W states. As well as ensuring no reconvergence before 4 transitions, this code ensures that every path divergence occurs into one V state and one W state, and every path convergence occurs from one V state and one W state. This ensures that both the second transition-pair of nearest neighbour paths, and the transition-pair prior to the reconvergence-pair each contribute a further squared distance of 1, giving a coding gain of $10*LOG(6/2)=4.77$ dB.

Yet a further requirement in defining the codes in question is that the mapping of the one information bit onto the state transitions or signals must be clearly specified in a manner which enables those skilled in the art to design and construct a circuit implementation. In particular, the correct sequence of information bits must be derived at the receiver independently of the 90-degree angular orientation of the received signal constellation. The requirement is that the information bit shall be mapped onto a signal-point transition. Rotational symmetry must be maintained in the mapping process, and it is therefore sufficient to define the mapping onto transitions from one signal point; mapping onto transitions from other signal points follow by rotational symmetry, eg by rotating a signal transition diagram through the relevant multiple of 90 degrees.

Figure 12:
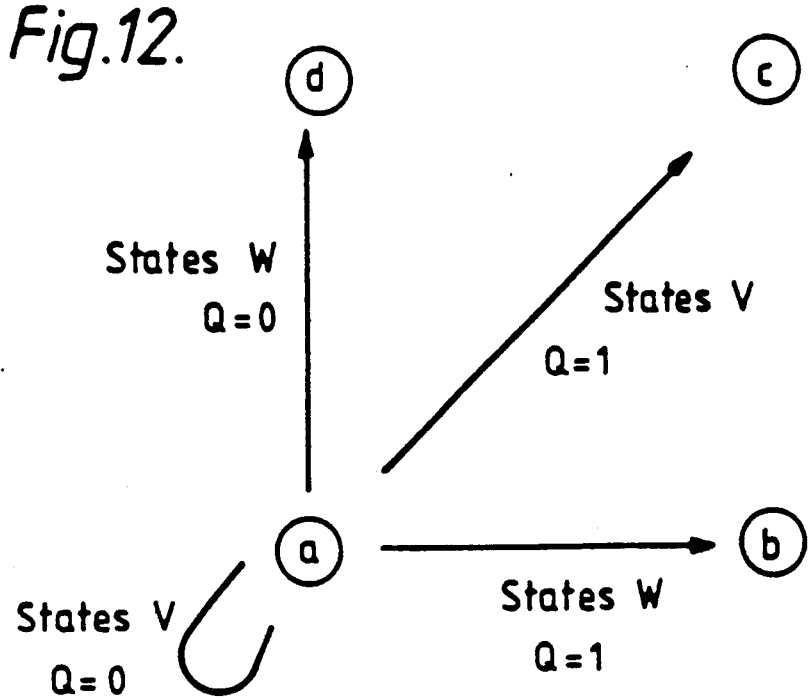
FIGS. 12 and 12a illustrate; information bit mapping and a state diagram.
Figure 12A:
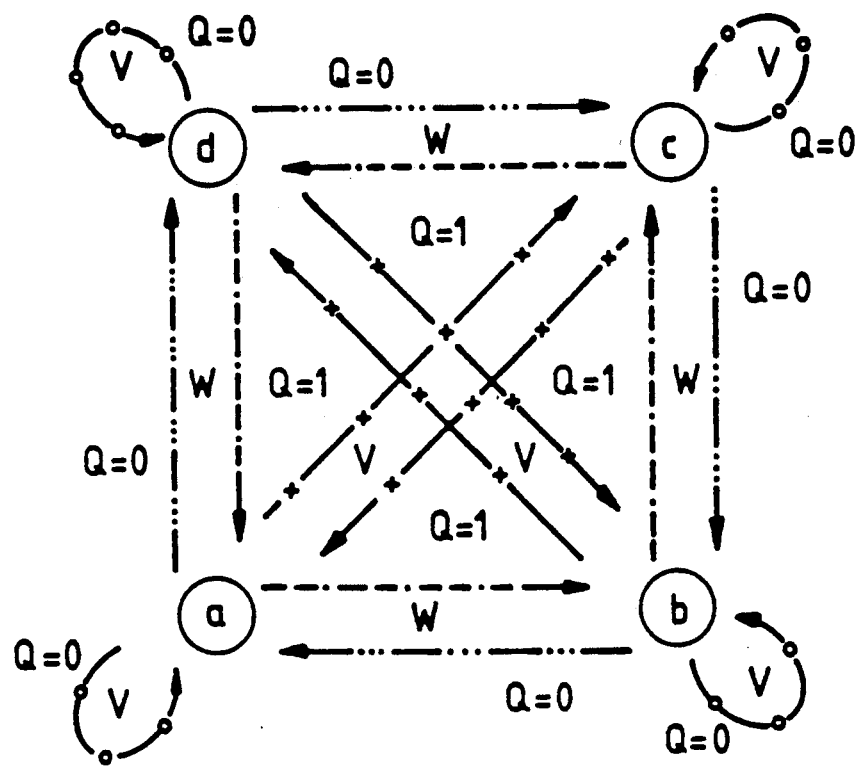

FIG. 12 shows 4 signal points a, b, c, d and two pairs of possible mappings of the information bit Q onto a transition from signal point 'a' to itself or to a different signal point. The mapping shown satisfies the previously stated desired objective for obtaining a large signal distance between all distinct code sequences, and is suitable for all the code examples detailed here, though could not be supported by a 4-state code providing 90-degree phase immunity (because the 4 state code cannot meet the preferred requirement of using diagonally opposite pairs on entering a state and on leaving a state). Signal point 'a' has corresponded to a transition into some state, say S1. If S1 is a 'V' state as already defined, then FIG. 12 defines the mapping of bit Q onto the transitions from signal point 'a' to signal points 'a' or 'C'; if S1 is a 'W' state as already defined, then Q is mapped onto the transition from 'a' to signal points 'd' or 'b'. For 90-degree immunity in the system, the direction of the transition mappings must be maintained for any 90-degree rotation of the signal transition diagram. FIG. 12a defines one mapping which satisfies the requirements. There are other obvious possibilities for mappings which would be equally good, obtained by interchanging either or both of the two $Q=0/Q=1$ mappings.

A state-transition diagram plus a signal-transition mapping diagram, both of the kind described herein together define the code and ensure that it has the desired properties.

It should be noted that the modulation codes defined by FIG. 9, 10 and 12a are more general than constrained V.32 codes; for example a variety of signal mappings are possible, whereas V.32 defines a code mapping strictly related to the use of modulo-4 differential coding.

Summarising the above criteria:

Firstly the following necessary criteria apply to the codes:

(1) Assuming that the states are drawn as one point each, joined by lines representing each possible transition from a state to a follower state, the diagram can be drawn so that it has quadrant symmetry-i.e. is unchanged by any number of 90° rotations.

(2) If one takes any sequence around the diagram of four lines occupying similar points in the diagram but displaced in the diagram by 0°, 90°, 180°, 270°, then the signal points assigned to those lines themselves form a series and all such series correspond to a given cyclic sequence of signal points. For example, if a sequence of four lines starting with signal point a give a series abdc then a sequence starting on b will give a series bdca.

(3) The mapping of the signal points, when represented by a diagram of the form of figure 12a must have 90° rotational symmetry.

Secondly, it is desirable, though not of course essential, to maximise the coding gain, and this leads to further criteria which may be applied:

(4) The two alternative paths from a state correspond to output signals which, in the phase diagram, are 180° apart. Likewise, with the two paths entering a state. Whilst this objective primarily concerns the mapping between the encoder states (and, optionally, the input signal) and the signal points, it has implications for the encoder itself since not all diagrams make this possible.

(5) It is evident that, taking any pair of states (or one state) that, there can be two routes of the same length, via other states, between them (or back to itself). The larger is the minimum length of those two routes (for any pair of states, or any state), the higher is the coding gain. Therefore this minimum length should be as great as possible.

(6) When condition 3 is satisfied, a further desirable feature is that in each three state sequence permitted by the encoder, for a given first state, the four possible transitions between the second and third of those states are assigned different respective ones of the four signal points.

A second embodiment of coding apparatus will now be described which again uses the diagram of FIG. 9, but development of the circuit from the diagram rather than from the V32 convolutional coder results in a simpler hardware implementation.

The development of the coder comprises three stages: selection of the convolutional encoder diagram (discussed above), assignment of the points of the phase diagram to the state transitions, and obtaining the correct relationship between the state transitions and the input signal.

Consider first the output points. Suppose they are a first pair A1, A2 at 0° and 180° in the phase diagram (FIG. 13) and a pair B1, B2 at 90° and 270°. As before, they are all of equal amplitude. It is manifest that one must select between two follower states from any state.

For phase jump immunity:

(1) It is self-evident that coding such that any sequence of two signal points having a given (signed) phase difference must always have the same meaning. (ii) A 90° (or n×90°) phase jump will cause transposition of the signal points. This must not result in an inadmissible sequence of points. This has implications for the form of the state diagram and for the assignment between transitions and signal points as set out in the numbered criteria above.

The state diagram of FIG. 9 is reproduced in FIG. 14, the states being arbitrarily numbered 1 to 8 for reference. The first choice of assignment is arbitrary, so we associate A1 with the self-transition of state 1. Condition 3 then gives A2 for the state 2-state 1 and state 1-state 3 transitions, and hence also for the state 2-state 3 transition.

Continual repetition of signal point A1 is associated with repetition of state 1. If 90° phase jump immunity is to be achieved, continual repetition of the other signal point A2 must also be allowable and hence it must be associated with one of the other three self repeating state transitions. Symmetry suggest choosing that of state 8—in fact this is desirable since it means that criterion (6) above is satisfied. Similar considerations lead one to associate B1 and B2 with states 6 and 7 (or viceversa, but the choice is arbitrary, representing only lateral inversion of FIG. 13). The transition moving clockwise from each of these corner points (1 to 3, 7 to 5 etc) follows. Application of condition 3 gives us the remaining assignments—which, it will be observed are consistent with criterion (2).

The assignments are shown on FIG. 14.

Now try to associate the input signal with the diagram. For 90° phase jump immunity, we have to ensure that a two-symbol sequence of a <u>given</u> phase difference represents the same input value as any other two-symbol sequence with the same phase difference.

There are four such phase differences (0,90,180,270). Each can occur as a result of two three-state sequences which are distinct in terms of the diagram's symmetry; for example two 0° two symbol (three state) sequences are marked in FIG. 14—A1A1 and A2A2. There are another three such pairs in the other three quadrants.

Suppose we say that '0' input to the apparatus can give a 0° phase differential. We must then associate one of the other three phase differences with '0'. The remaining two then are associated with a '1' input. The condition that the two transitions leaving a state are associated with signal points at 180° to one another means that we cannot associate phase differences 0° and 180° with '0' input. There is no obvious functional criterion for deciding between 90° and 270°, so make it to ease the coding.

Draw the other angles on FIG. 14. By inspection the 0° and 270° sequences have start and end states which are either both ones of the inner states 2,3,4,5 or both ones of the outer states 1,6,7,8; the 90° and 180° sequences involve a change between inner and outer. It seems convenient to associate them on this basis.

Consider now a single transition. The inner transitions invariably involve a move one clockwise. A parametric notation for the states with 1 bit (say P) indicating inner '1' or outer '0', and two bits (QR) indicating a sequential position round the diagram (OO for state 3, 01 for state 5, 10 for state 5) suggests itself. If state 1 is given the same "position" (OO) as state 3, state 7 as state 5 etc., then: Every transition from an inner state involves a change of sequential position: every transition from an outer state involves no such change.

Thus 0 input implies 0° or 270° sequence:
P=0 (outer) goes to P=0
P=1 (inner) goes to P=1
1 input implies 90° or 180° sequence
P=0 (outer) goes to P=1
P=1 (inner) goes to P=0
i.e.
0 input implies P→?→P
1 input implies P→?→P Draw a latch 31 (FIG. 15) for P, and give it an input H (via exclusive—OR Feedback arrangement 32) such that if H=1, P changes, and if H=0, P does not change. Then possible sequences of H give 00 P→P→P corresponds to 0 input
01 P→P→P corresponds to 1 input
10 P→P→P corresponds to 1 input
11 P→P→P corresponds to 0 input Thus, if H is a differential version of the input represented by delay 33 and exclusive—OR 34, the desired result will be obtained.

Looking again at FIG. 14 a transition from an inner state always involves incrementing the sequence number QR by one. A transition from an outer state does not. Therefore QR appears in the coder as a counter which increments only if the preceding value of P is 1.

Figure 15:
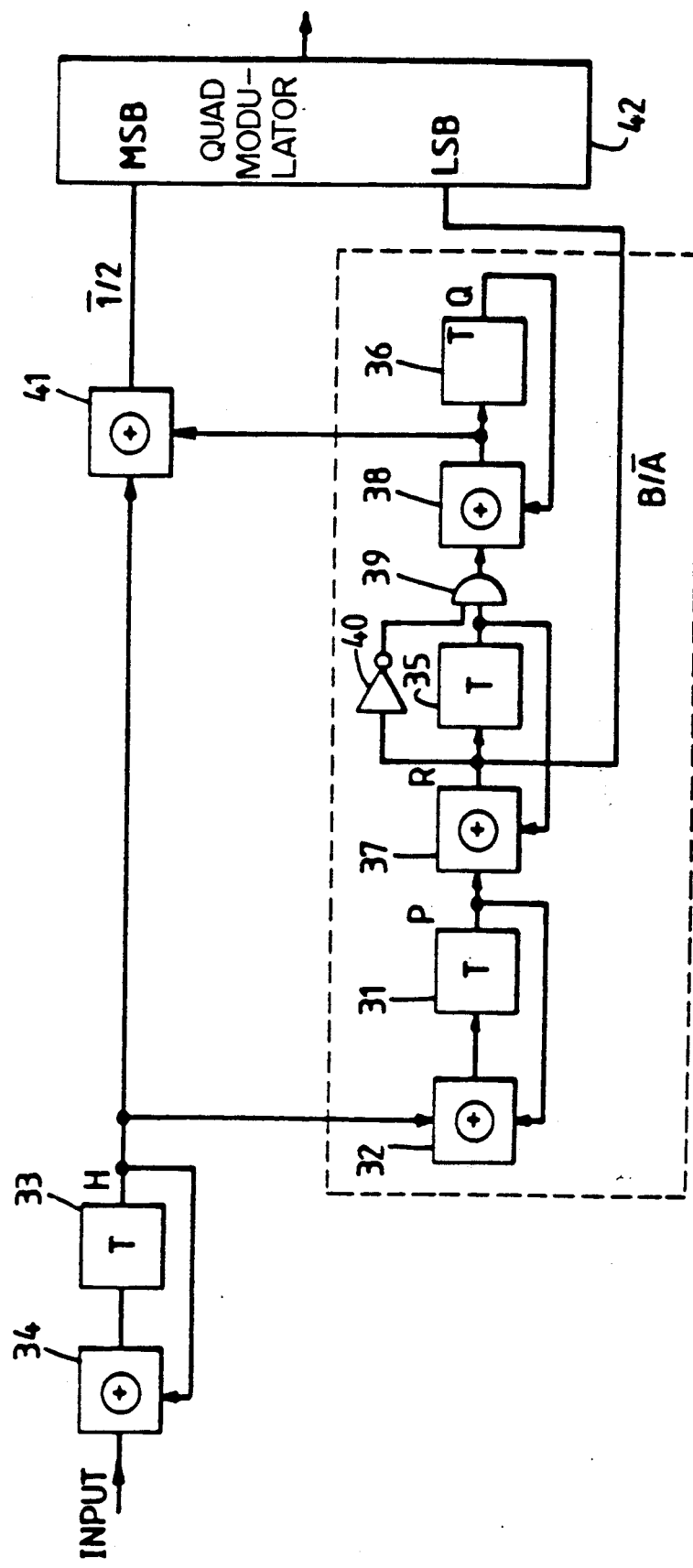
FIG. 15 is a block diagram of that second embodiment of coding apparatus.

This appears in FIG. 15 as delays 35,36, exclusive—OR gates 37,38, AND gate 39 and inverter 40.

Now we need to code the output points. Inspection of FIG. 14 redrawn at FIG. 16 with PQR indicated instead of the original numbers (which we now discard) indicates that states X00 and X10 are always approached by signal points from subset A, and X01 and X11 by those from subset B. Hence the new value of bit R is indicated on FIG. 15 as B/A.

It can also be seen from the diagram that symbol A1 or B1 results from a transition involving a change of P if the new QR (call them Q',R')=01 or 10, or one not involving a change of P if Q' R'=11 or 00. Defining ½ as being 0 for A1 and B1 and 1 for A2 and B2, So NOT ½=[(change of P) AND(Q'⊕R')]OR [(no change of P) AND(Q'⊕R')]

P changes only if H=1, so $$1/2 = \text{NOT} [(H \text{ AND}(Q' \oplus R')) \text{ OR } (\overline{H} \text{ AND}(\overline{Q' \oplus R'}))]$$
$$= H \oplus Q' \oplus R'$$

However R is 1 only for the B subset so if we reverse the B1B2 labels we can say:

½=H⊕Q' with the signal points as in FIG. 17a. Output ½ is thus generated in FIG. 15 by an exclusive-OR gate 41 fed with H from the delay 33 and with Q from the input of the delay 36.

Writing B/A as MSB and ½ as LSB we can call the points

00 A1
01 A2
10 B1
11 B2  Δ FIG. 17b

The complete coder shown in FIG. 15 has a quadrature modulator 42, with the behaviour defined by FIG. 17b.

Although only 8-state convolutional coders have been described, other numbers of states (provided of course that they are four or a multiple of four) may be used; for example, four, twelve or sixteen states may be employed.

FIG. 18 shows a state diagram for a coder using a 16-state convolutional encoder (the states are numbered arbitrarily from 0 to 15. Signal point assignments are indicated by the use of solid, broken, dotted and dot-dash lines corresponding to the signal point phases also illustrated on the diagram. It will be seem that the diagram satisfies the symmetry condition (criterion 1) discussed above, and that the signal point assignments also satisfy criteria (4) and (6). This code represents an asymptotic coding gain of 4.77 dB and again provides 90 degree phase jump immunity for 1 information bit per symbol, on a four point signal constellation.

Designating the signal points by binary numbers 00,01,10,11 as shown in the figure, we call the individual bits of this number H and L, and represent the number by H:L. If the current state is known then it can be seen that the value for L preceding the state and the new value for L (call it L') are also known.

If (as before) the required differential output phase for a given value of input data X is
—0° or 270° for X=0
—90° or 180° for X=1 then $X = 0$ implies $H':L' = H:L + _{MOD4}0:0$
or $H:L + _{MOD4}1:1$
$X = 1$ implies $H':L' = H:L + _{MOD4}0:1$
or $H:L + _{MOD4}1:0$ i.e. $H':L'=H:L+_{MOD4}(X\oplus A):A$ (where A is undefined)
Separating the addition
$$L'=L\oplus A \quad (3)$$

$$H'=H\oplus X\oplus A\oplus(L\cdot A)=H\oplus X\oplus(\overline{A}\cdot L) \quad (4)$$

From equation (3)
$A=L\oplus L'$

So $$H'=H\oplus X\oplus(L\cdot(L\oplus L'))=H\oplus X\oplus(L\cdot \overline{L'}) \quad (5)$$

FIG. 19 shows an apparatus for implementing the code of FIG. 18. The current encoder state (in any convenient 4-bit representation-but see below) is stored in a four-bit latch 50; the latch feeds four address inputs of a read-only memory 51 whose data output represents the next state, dependent also on a fifth address input. L and L' are obtained from the current state by a decoder 52. A 3 input modulo-2 adder 53 and AND gate 54 form H' as specified by equation (5), H being obtained via a delay 55 from H'. H' and L' feed a quadrature modulator 56.

In order to produce the next encoder state, the read-only memory 51 requires information as to the current state and one bit indicating which of the two possible follower states is selected. This information is carried by H' which accordingly is connected to the fifth address input.

The flexibility of the look-up table approach means that the four bit representation of the states is arbitrary; however, if one of the four bits is made to equal L' (if the binary representation of the state numbers shown in FIG. 18 is used the least significant bit equals L') then the decoder 52 becomes redundant. L can be obtained via a delay.

The apparatus of FIG. 19 essentially comprises a convolutional encoder (latch 50 and ROM 51); mapping means responsive to the coder states and data input (decoder 52, gate 54, adder 53, delay 55, and modulator 56; and input means to control the encoder state transitions (52,53,54,55—shared with the mapping means—and the connection of H' to the read only memory 51).

We claim:
1. A coding apparatus comprising:

(i) a convolutional coder having a plurality n of defined states and operable at regular intervals to assume a state which, for any preexisting state, is one of two mutually different states according to the binary value of an input thereto, such that the behaviour of the coder is capable of being represented by a diagram in which each such state is represented by a point and each transition, and its direction between two states or from a state to the same state, is represented by a line whose ends are joined to the point representing those states or that state, said diagram being unchanged when rotated by any multiple of 90 degrees;

(ii) mapping means responsive to said coder states to generate in response to each possible pair of consecutive states an assigned one of four signals having relative phases 0, 90, 180 and 270 degrees, the assignment being such that each possible sequence of three consecutive coder states gives rise to a pair of assigned signals having the same signed phase difference as would a pair generated by a corresponding coder state sequence which, in said diagram, occupies a position rotated by 90° from that of said three consecutive coder state sequence; and (iii) input means responsive to a single bit input stream producing said binary input to said convolutional coder to control the state transitions so that one bit value gives rise to a signal of phase difference a or b from the preceding signal and the other bit value gives rise to a signal of phase difference c or d from the preceding signal, where a, b, c and d have different values and said values being in any order 0, 90, 180 and 270 degrees.

2. An apparatus according to claim 1 in which the assignment of said mapping means is such that, for any coder state, the two possible transitions from that state are assigned signals having a mutual phase difference of 180°.

3. An apparatus according to claim 1 in which the assignment of signals by said mapping means is such that, for any coder state, the two possible transitions by which the state is reached are by assigned signals having a mutual phase difference of 180°.

4. An apparatus according to claim 3 wherein for a given first state of a three state sequence of said coder, the four possible transitions between the second and third states are each assigned different signals by said mapping means.

5. An apparatus according to claim 1, in which the assignment of signals by said mapping means is such that for each series, in a given direction around said diagram, of four lines which occupy similar positions at relative angular positions of 0°, 90°, 180° and 270° in said diagram, the corresponding series of assigned signals corresponds to the same predetermined cyclic series of four different signals.

6. An apparatus according to claim 1 in which said convolutional coder has eight states and three transitions is the minimum number by which the coder can progress via two different paths each having the same number of transitions, from a common starting state to a common finishing state.

7. A coding apparatus comprising:
(i) a convolution coder receiving a binary input and having a plurality of defined states, said coder transitions at regular intervals from a preexisting state to one of two mutually distinct states according to the binary value of said binary input, the operation of said coder being capable of representation by a diagram in which each state corresponds to a point and each transition corresponds to a line between points or which begins and ends at a single point, and the points and lines on said diagram being unchanged by rotating the diagram in 90 degree increments;

(ii) mapping means for generating an assigned signal in response to each possible pair of consecutive states of said coder, each assigned signal being one of four signals having phases of 0, 90, 180 and 270 degrees relative to each other, each pair of assigned signals for every three state sequence of said coder having the same signed phase difference as a pair of assigned signals corresponding to a sequence on said diagram rotated 90 degrees from said three state sequence;

(iii) input means for generating said binary input to said coder using a single bit input stream, said binary input controlling said coder transitions such that one bit of said binary input having a first binary value causes a signal phase difference of a or b from the preceding signal and said one bit having a second binary value causes a signal phase difference of c or d from the preceding signal, where a, b, c and d have different values and said values being in any order 0, 90, 180 and 270 degrees.

8. A method of transmitting a bit sequence by modulating a carrier to generate in a convolution coder a series of signals each having a phrase and an amplitude, comprising:
(a) receiving a single bit input stream;
(b) controlling in response to said single bit input stream the convolutional coder having a plurality of defined states, said convolutional coder assuming at regular intervals a state which, for any preexisting state, is one of two mutually different states, such that the behavior of the coder is capable of being represented by a diagram in which each state is represented by a point and each transition, and its direction between two states or from a state to the same state, is represented by a line whose ends are joined to the points or point representing those states or that state, said diagram being unchanged when rotated by any multiple of 90 degrees; and
(c) generating said signals in response to said coder states, each possible pair of consecutive states producing an assigned one of four signals having relative phases 0, 90, 180 and 270 degrees, the assignment being such that each possible sequence of three consecutive coder states gives rise to a pair of assigned signals having the same signed phase difference as would a pair generated by a corresponding coder state sequence which, in said diagram, occupies a position rotated by 90° from that of said three consecutive coder state sequence wherein, in said step (b) of controlling said convolutional coder, the state transitions are controlled so that one bit value results in generation of a signal of phase difference a or b from the preceding signal and the other bit value results in generation of signal of phase difference c or d from the preceding signal, where a, b, c and d have different values and said values being in any order 0, 90, 180 and 270 degrees.

9. A method according to claim 8 wherein in step (c) the two possible transitions from any coder state are assigned signals having a mutual phase difference of 180°.

10. A method according to claim 8 wherein in step (c) the assignment of signals is such that, for any coder state, the two possible transitions by which the state is reached are by assigned signals having a mutual phase difference of 180°.

11. A method according to claim 8 wherein in step (c) for a given first state of three consecutive coder states the four possible transitions between the second and third states are each assigned different signals.

12. A method according to claim 8, wherein in step (c) the assignment of signals is such that for a given direction around said diagram each series of four lines which occupy similar positions at relative angular positions of 0°, 90°, 180° and 270° in said diagram the corresponding series of assigned signals corresponds to the same predetermined cyclic series of four different signals.

13. A method according to claim 8 wherein the convolutional coder has eight states and three transitions is the minimum number by which the coder can progress via two different paths each having the same number of transitions, from a common starting state to a common finishing state.

* * * * *

UNITED STATES PATENT AND TRADEMARK OFFICE
CERTIFICATE OF CORRECTION

PATENT NO. : 5,054,036

DATED : October 1, 1991

INVENTOR(S) : BROWNLIE et al

It is certified that error appears in the above-identified patent and that said Letters Patent is hereby corrected as shown below:

Column 1, line 13, "states" should read --<u>states</u>--.

Column 2, line 24, delete the semicolon.

Column 2, line 48, "signal appropriate" should read --signal. Appropriate--.

Column 2, line 53, "Y1,Y2" should read --$\hat{Y}1$, $\hat{Y}2$--.

Column 2, line 55, "Q" should read --$\hat{Q}$--.

Column 2, line 56 "Y1, Y2" should read --$\hat{Y}1$, $\hat{Y}2$--.

Column 5, line 66, after "symmetry" the following words should appear:
--Figure 9 shows a state transition diagram drawn for the--.

Column 8, line 42, " 'C' " should read --'c'--.

Column 10, line 68, "P→?→P" should read --P→?→$\overline{P}$--.

Column 11, line 6, "P→P→P" should read --P→P→$\overline{P}$--.

Column 11, line 7, "P→P→P" should read --P→$\overline{P}$→$\overline{P}$--.

Column 11, line 8, "P→P→P" should read --P→$\overline{P}$→P--.

Column 11, line 12, "from" should read --<u>from</u>--.

Column 11, line 25, "B/A" should read --B/$\overline{A}$--.

Column 11, lines 29 and 31, "½" should read --$\overline{1}/2$--.

Column 11, line 32, "(Q' ⊕ R')" should read --$\overline{(Q' \oplus R')}$--.

Column 11, line 36, "½ = NOT[(H AND(Q' ⊕ R')) OR (H AND (Q' ⊕ R''))]" should read -- $\overline{1}/2$ = NOT [(H AND(Q' ⊕ R')) OR (H AND $\overline{(Q' \oplus R')}$)]--.

Column 11, lines 41, 42 and 45 "½" should read --$\overline{1}/2$--.

Column 11, line 45, "B/A" should read --B/$\overline{A}$--.

Column 11, line 50, " △ " should be omitted.

UNITED STATES PATENT AND TRADEMARK OFFICE
CERTIFICATE OF CORRECTION

PATENT NO.   :   5,054,036
DATED        :   October 1, 1991
INVENTOR(S)  :   BROWNLIE et al It is certified that error appears in the above-identified patent and that said Letters Patent is hereby corrected as shown below:

Column 12, line 26, "L" (second occurrence) should read --$\overline{L}$--.

Column 12, line 39, "L" should read --$\overline{L}$--.

Column 12, line 32, "L" (first and fourth occurrences) should read --$\overline{L}$--.

Column 13, line 11, "point" should read --point(s)--.

Column 14, line 31, "phrase" should read --phase--.

Signed and Sealed this

Sixteenth Day of March, 1993

*Attest:*

STEPHEN G. KUNIN

*Attesting Officer*   Acting Commissioner of Patents and Trademarks